(12) United States Patent
Kume et al.

(10) Patent No.: US 10,107,850 B2
(45) Date of Patent: Oct. 23, 2018

(54) ABNORMALITY DETECTING CIRCUIT AND ABNORMALITY DETECTING METHOD

(71) Applicant: FUJITSU TEN LIMITED, Kobe-shi, Hyogo (JP)

(72) Inventors: Masayoshi Kume, Kobe (JP); Keisuke Kido, Kobe (JP)

(73) Assignee: FUJITSU TEN LIMITED, Kobe-shi (JP)

( * ) Notice: Subject to any disclaimer, the term of this patent is extended or adjusted under 35 U.S.C. 154(b) by 156 days.

(21) Appl. No.: 15/158,168

(22) Filed: May 18, 2016

(65) Prior Publication Data

US 2016/0377666 A1  Dec. 29, 2016

(30) Foreign Application Priority Data

Jun. 24, 2015 (JP) ................................. 2015-126345

(51) Int. Cl.
*G01R 31/40* (2014.01)
*G01R 31/02* (2006.01)
*H03K 5/08* (2006.01)
*G01R 31/44* (2006.01)

(52) U.S. Cl.
CPC ........... *G01R 31/025* (2013.01); *G01R 31/40* (2013.01); *G01R 31/44* (2013.01); *H03K 5/08* (2013.01)

(58) Field of Classification Search
CPC ........ G01R 31/42; G01R 31/40; G01R 31/26; G01R 31/2642; G01R 31/2648; G01R 31/2831; G01R 31/31702
See application file for complete search history.

(56) References Cited

U.S. PATENT DOCUMENTS

2011/0002073 A1 * 1/2011 Fukuda ................... H03F 1/523
　　　　　　　　　　　　　　　　　　　　　　　　　　　　　361/87
2012/0154969 A1 * 6/2012 Kim ................. G01R 19/16571
　　　　　　　　　　　　　　　　　　　　　　　　　　　　　361/93.9

FOREIGN PATENT DOCUMENTS

JP　　2013-108819 A　　6/2013

* cited by examiner

*Primary Examiner* — Tung X Nguyen
(74) *Attorney, Agent, or Firm* — Oliff PLC

(57) ABSTRACT

There is provided an abnormality detecting circuit. A clamp unit is configured to clamp an output voltage which is output from another device, such that the upper limit of the output voltage becomes a first clamp voltage which is generated on the basis of a constant voltage generated from a power supply voltage, or a second clamp voltage which is generated on the basis of the power supply voltage and which varies depending on the power supply voltage. A short-to-power detection unit is configured to compare the output voltage clamped by the clamp unit, with a predetermined threshold value which is generated on the basis of the power supply voltage, thereby detecting occurrence of a short to power.

9 Claims, 9 Drawing Sheets

ABNORMALITY DETECTING CIRCUIT AND ABNORMALITY DETECTING METHOD

CROSS-REFERENCE TO RELATED APPLICATIONS

This application is based on and claims priority from Japanese Patent Application No. 2015-126345 filed on Jun. 24, 2015.

TECHNICAL FIELD

The present invention relates to an abnormality detecting circuit and an abnormality detecting method.

BACKGROUND

In the related art, a technology for detecting a short to power, a short to ground, and disconnection has been proposed (see Patent Document 1 for instance). In this technology, a detection voltage based on a comparative voltage which is lower than a power supply voltage and is higher than a reference voltage (GND) and a voltage between a power supply and a reference voltage unit is generated.

Patent Document 1: Japanese Patent Application Publication No. 2013-108819A

There is a case of generating a comparative voltage clamped to a predetermined upper limit value on the basis of a constant voltage and generating a detection voltage, as a threshold value for abnormality detection, on the basis of a power supply voltage. Further, a voltage clamped to a predetermined upper limit value on the basis of a certain voltage is also referred to as a clamp voltage. In this case, there is a possibility that the comparative voltage and the detection voltage may vary depending on different voltages, respectively, causing the relation of the magnitudes of the comparative voltage and the detection voltage to be inversed. In other words, if the power supply voltage falls to about the above described upper limit value for any cause, the detection voltage varies depending on the power supply voltage, whereas the comparative voltage does not vary. Therefore, it is feared to erroneously detect occurrence of an abnormality.

SUMMARY

It is therefore an object of the present invention to provide a circuit capable of keeping the relation of the magnitudes of a clamped comparative voltage and a detection voltage to be a threshold value for abnormality detection, thereby capable of preventing erroneous detection of a short to power, even in a case where a power supply voltage varies.

According to an aspect of the embodiments of the present invention, there is provided an abnormality detecting circuit comprising: a clamp unit configured to clamp an output voltage which is output from another device, such that the upper limit of the output voltage becomes a first clamp voltage which is generated on the basis of a constant voltage generated from a power supply voltage, or a second clamp voltage which is generated on the basis of the power supply voltage and which varies depending on the power supply voltage; and a short-to-power detection unit configured to compare the output voltage clamped by the clamp unit, with a predetermined threshold value which is generated on the basis of the power supply voltage, thereby detecting occurrence of a short to power.

A power supply is, for example, a battery, and the voltage of the power supply may vary. Also, the first clamp voltage or the second clamp voltage can be used as the comparative voltage described above, and the predetermined threshold value corresponds to the detection voltage described above. If the first clamp voltage which is generated on the basis of the constant voltage and the second clamp voltage which varies depending on the power supply voltage are used, for example, even in a case where occurrence of a short to power may be erroneously detected according to the relation of the magnitudes of the first clamp voltage and the predetermined threshold value, if the second clamp voltage is used, it is possible to keep the relation of the magnitudes of the clamp voltage and the detection voltage to be the threshold value for abnormality detection. In other words, it is possible to provide a circuit capable of keeping the relation of the magnitudes of the clamp voltage and the detection voltage to be the threshold value for abnormality detection, even in a case where the power supply voltage varies, thereby capable of avoiding erroneous short-to-power detection.

The first clamp voltage may be a voltage higher than the constant voltage by a predetermined value, the second clamp voltage may be a voltage lower than the power supply voltage by a predetermined value, and the clamp unit may select a lower voltage of the first clamp voltage and the second clamp voltage, and clamp the output voltage to the selected voltage. Also, the constant voltage can be generated, for example, from the power supply voltage by regulation. Also, if the voltage higher than the constant voltage by the predetermined value is used as the first clamp voltage, even if a short to power does not occur, the output voltage may exceed the predetermined threshold value described above. However, if the second clamp voltage lower than the power supply voltage by the predetermined value, and a lower voltage of the first clamp voltage and the second clamp voltage is selected, it is possible to keep the relation of the magnitudes of the predetermined threshold value and the clamp voltage.

The another device may be a predetermined sensor, and the sensor can output a voltage having a magnitude close to the power supply voltage in an inactive state after start-up. In the case of this sensor, it is required to clamp the output voltage of the sensor by the clamp unit, thereby preventing the output voltage from being input to another device. If the configuration capable of avoiding erroneous short-to-power detection as described above is used, it is possible to improve the accuracy of short-to-power detection.

The clamp unit may include a first PNP transistor having a base to which the first clamp voltage is input, and a second PNP transistor having a base to which the second clamp voltage is input, and an emitter of the first PNP transistor and an emitter of the second PNP transistor may be connected to each other. According to this configuration, a transistor having a base to which a lower voltage is input is activated, whereby it is possible to select a lower voltage of the first clamp voltage and the second clamp voltage.

Further, the constructions of means for solving the problem can be combined as long as the combination does not depart from the object and technical idea of the present invention. Also, the constructions of means for solving the problem may be provided as methods which an apparatus performs.

It is possible to keep the relation of the magnitudes of a clamped comparative voltage and a detection voltage to be a threshold value for abnormality detection, thereby capable of preventing erroneous detection of a short to power, even in a case where a power supply voltage varies.

DETAILED DESCRIPTION OF THE EMBODIMENTS

Hereinafter, the present invention will be described in more detail with reference to the accompanying drawings. The drawings show a preferred embodiment. However, the present invention can be embodied in many different forms, and is not limited to the embodiment to be described in this specification.

<Outline of System>

Figure 1:
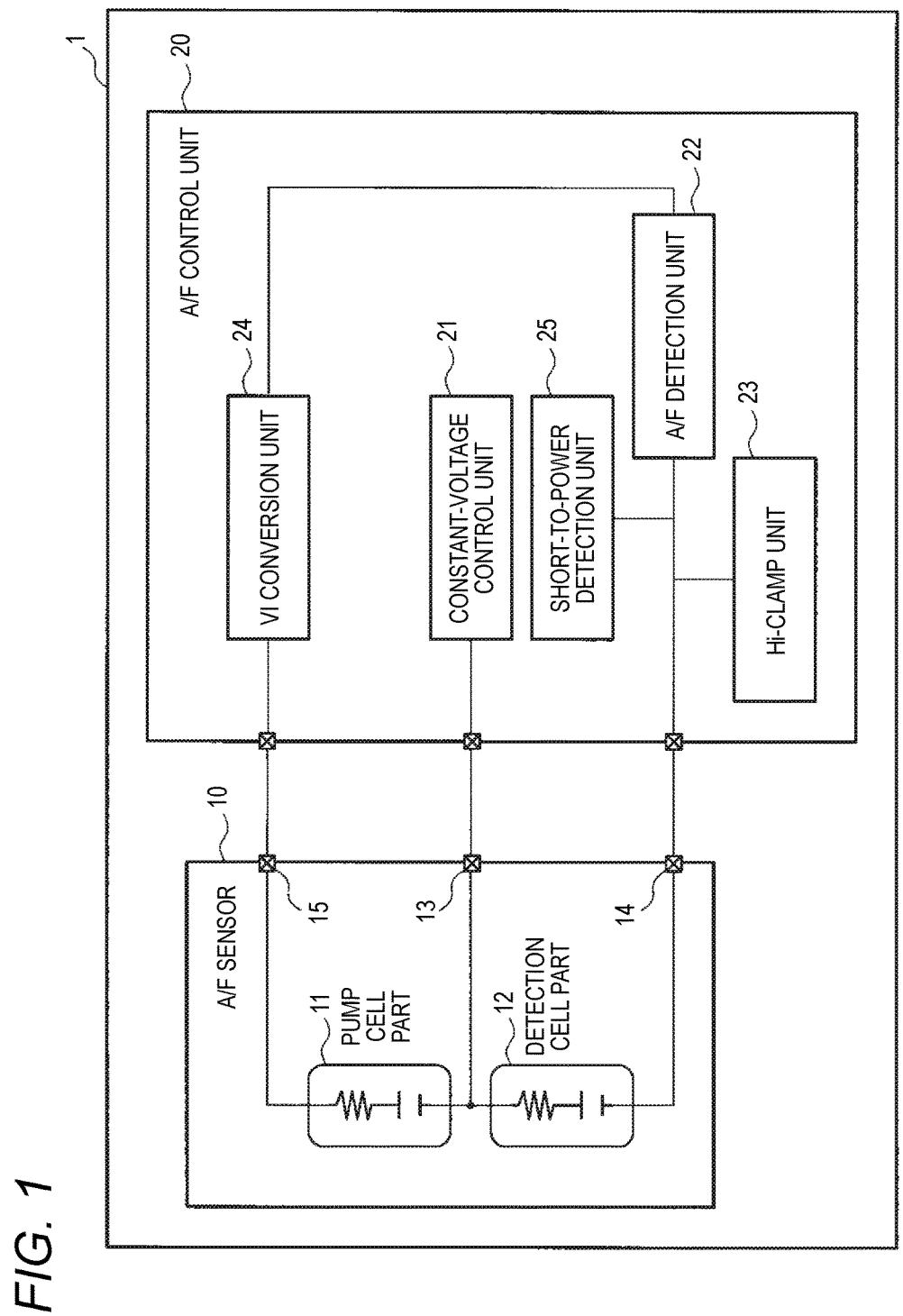
FIG. 1 is a block diagram illustrating an example of an engine control system.

FIG. 1 is a block diagram illustrating an example of an engine control system according to the present embodiment. An engine control system 1 of FIG. 1 includes an A/F sensor 10 for measuring the ratio of air and fuel to combust in an internal combustion engine (also referred to as the "A/F (Air/Fuel) value"), and an A/F control unit 20 for controlling the A/F value such that the A/F value approaches the theoretical air fuel ratio at which combustion efficiency is high. The A/F sensor 10 is a sensor having two cells (also referred to as a "double-cell type sensor"), and includes a pump cell part 11 for pumping (sucking and exhausting) oxygen, and a detection cell part 12 for measuring an A/F value on the basis of the concentration of oxygen in exhaust gas, and converting the A/F value into a voltage, and outputting the voltage. Also, the A/F sensor 10 includes a COM input part 13 which is a terminal to which a constant voltage to be a reference (also referred to as a "reference voltage" or a "COM voltage") is input, a VS output part 14 which is a terminal from which a voltage representing a measured A/F value is output, and an IP input part which is a terminal for receiving a current input representing the amount of oxygen which the pump cell part 11 should suck. Meanwhile, the A/F control unit 20 is a unit including an engine control unit (ECU) and so on, and includes a constant-voltage control unit 21 which generates the reference voltage at the COM input part 13 of the A/F sensor 10, an A/F detection unit 22 which receives the output voltage of the VS output part 14 and obtains the difference between the output voltage and an ideal voltage, an Hi-clamp unit 23 which clamps the upper limit of the voltage which is input to the A/F detection unit 22, a VI conversion unit 24 which generates a current for indicating the amount of oxygen which a pump cell should suck, by a voltage-current conversion amplifier, and a short-to-power detection unit 25 which detects a short to a battery. Also, in the present embodiment, the Hi-clamp unit 23 and the short-to-power detection unit 25 form an abnormality detecting circuit.

If the detection cell part 12 of the A/F sensor 10 measures an A/F value, not only the reference voltage but also a voltage generated according to the A/F value in the detection cell part 12 are output from the VS output part 14. Here, the voltage which is generated in the detection cell part 12 is in a range predetermined during design, and in a case of a theoretical air fuel ratio (the A/F value is 14.7) (also referred to as an "ideal voltage") is known in advance. For example, it is assumed that the reference voltage of the COM input part 13 is 3.3 V, and the ideal voltage which the VS output part 14 should output is 3.75 V. The A/F detection unit 22 obtains the difference between the ideal voltage and a voltage representing the measured A/F value, and generates a current for indicating the amount of air to be sucked into the pump cell part 11, on the basis of the difference, such that the A/F value approaches the theoretical air fuel ratio. Thereafter, the processing returns to detection of the detection cell part 12 on a voltage according to an A/F value, and the above described processing is repeated. By this feedback control, the engine control system 1 approximates the voltage to be output by the detection cell part 12, to the ideal voltage.

Also, the A/F sensor 10 is installed in an exhaust pipe or the like, and is connected to the A/F control unit 20 by a harness. In this configuration, if a short-circuit of the harness to the battery (also referred to as a "short to power") occurs, it is feared that an excess voltage may be applied between the terminals of the A/F sensor 10, resulting in breakdown of the A/F sensor 10. For this reason, the short-to-power detection unit 25 detects occurrence of a short to power on the basis of the output voltage of the VS output part 14, and outputs a signal representing occurrence of the short to power, thereby stopping the system such that breakdown of the A/F sensor 10 is prevented. A threshold value for a voltage for detecting a short to power is set to a value lower than the battery voltage (also referred to as the "power supply voltage") by a predetermined value, and, for example, in a case where the output voltage of the VS output part 14 is equal to or greater than the threshold value, occurrence of a short to power is detected. In the present embodiment, it is assumed that the battery voltage is 12.0 V and the threshold value is a value lower than the battery voltage by 1.5 V.

Also, the voltage which is generated in the detection cell part 12 is in the range predetermined during design as described above, and is, for example, between 0 V and 1.0 V in an active state where the detection cell part 12 has been sufficiently heated. However, like in a predetermined period immediately after start-up of the engine, in an inactive state where the A/F sensor 10 has not been sufficiently heated, since the impedance of the detection cell part 12 is high, the output voltage of the VS output part 14 may rise to about the battery voltage. In this case, in order to prevent the shortto-power detection unit 25 from erroneously detecting occurrence of a short to power, the Hi-clamp unit 23 clamps the output voltage of the VS output part 14 such that the output voltage does not rise to a predetermined voltage or more. A clamp voltage which is the upper limit value of the voltage is set to a value higher than the reference voltage by a predetermined voltage such that the difference between the clamp voltage and the reference voltage does not become a predetermined value or more. Here, the reference voltage and the clamp voltage which are constant voltages are generated using a constant voltage which is generated from the battery voltage by regulation in the A/F control unit 20. Therefore, the reference voltage and the clamp voltage are not influenced even if the battery voltage varies in some degree. For example, it is assumed that the clamp voltage is set to a value higher than the reference voltage by 3.0 V. Also, even in a case where the Hi-clamp unit 23 as described above has been provided, if a short to power actually occurs, since the capability of the clamp function reaches its limit, the output voltage from the VS output part 14 rises to about the battery voltage, and short-to-power detection becomes possible.

<Clamp and Short-to-Power Detection>

Figure 2:
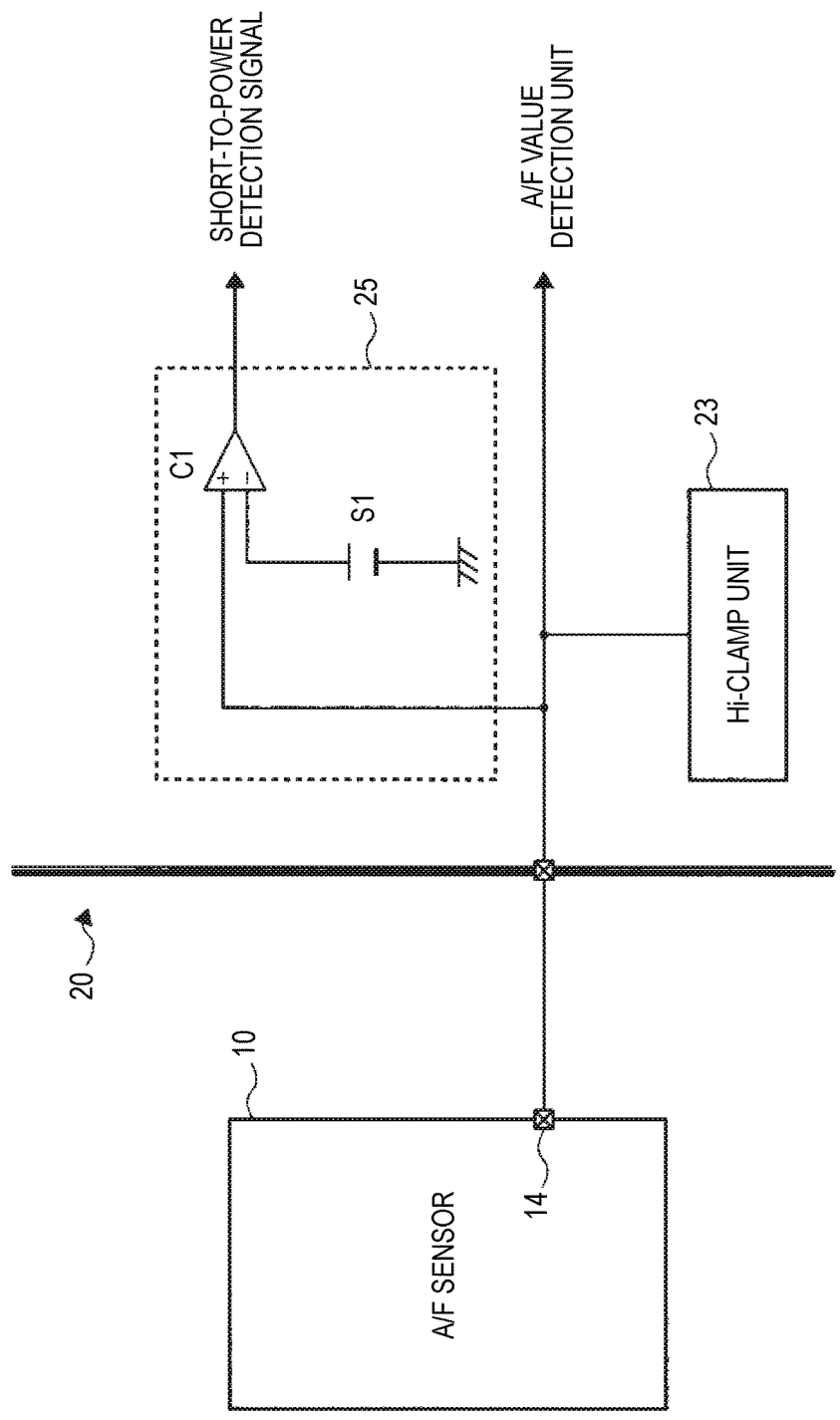
FIG. 2 is a block diagram for explaining clamp and short-to-power detection.

FIG. 2 is a block diagram for explaining clamp and short-to-power detection. The block diagram of FIG. 2 includes the VS output part 14 of the A/F sensor 10, a comparator C1 which forms the short-to-power detection unit 25 of the A/F control unit 20, and the Hi-clamp unit 23. In a case where the voltage which is output from the VS output part 14 exceeds the clamp voltage, the Hi-clamp unit 23 limits the output voltage to the clamp voltage. If a threshold value S1 for short-to-power detection and the output voltage from the VS output part 14 are input to the comparator C1, the comparator compares them. If the output from the VS output part 14 is larger, the comparator C1 outputs a signal representing detection of a short to power.

Comparative Example

Figure 3:
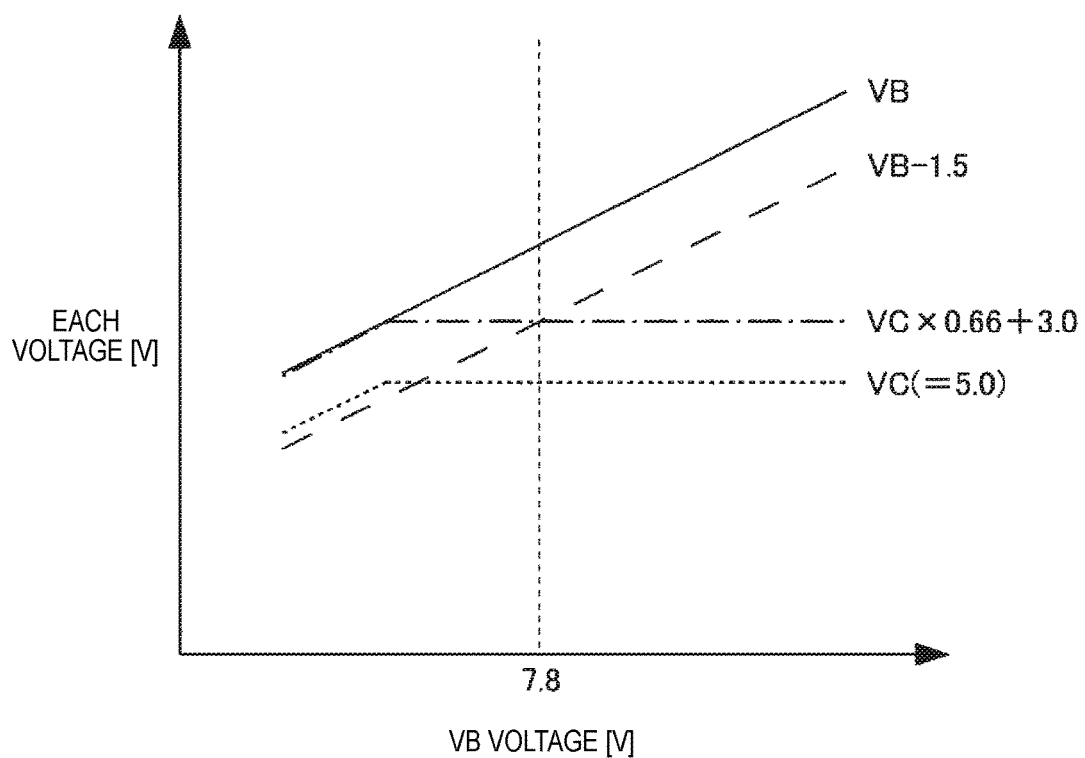
FIG. 3 is a graph illustrating an example of the relation between variation in battery voltage and the value of each voltage according to a comparative example.

FIG. 3 is a graph illustrating an example of the relation between variation in battery voltage and the value of each voltage according to a comparative example. The vertical axis represents the value of each voltage, and the horizontal axis represents battery voltage VB. The magnitude of the voltage VB may vary for any cause, and FIG. 3 shows an example in which the magnitude of the voltage VB linearly varies from a normal value of, for example, about 12.0 V to 5.0 V or less. Also, the threshold value for short-to-power detection (also referred to as the "short-to-power detection level") is a value lower than the battery voltage VB by a predetermined voltage. In the example of FIG. 3, the threshold value is shown by a broken line and has a specific value of −1.5 V. A constant voltage VC is a voltage which is generated on the basis of the battery voltage VB by regulation in the A/F control unit 20, and is shown by a dotted line (a fine broken line) in FIG. 3. Specifically, the voltage VC is, for example, 5.0 V. On the basis of the constant voltage VC, the reference voltage and the clamp voltage described above are generated. However, if the battery voltage VB is less than about 5.5 V, a regulator cannot generate 5.0 V, and the constant voltage VC decreases as the battery voltage VB decreases. Also, the clamp voltage is the upper limit of the voltage which is input to the A/F detection unit 22, and is generated using the constant voltage VC. In FIG. 3, the clamp voltage is shown by an alternate long and short dash line. The clamp voltage is set to, for example, 6.3 (=VC×0.66+3.0) V. This clamp voltage depends on the value of the constant voltage VC, and the clamp voltage decreases as the constant voltage VC decreases. In this example, if the battery voltage VB decreases to about 7.8 V, the short-to-power detection level decreases to about 6.3 V on the basis of the battery voltage VB. Meanwhile, since the regulator still can generate a constant voltage, the clamp voltage depending on the constant voltage VC is maintained at 6.3 V. Therefore, if the battery voltage VB becomes 7.8 V or less, the relation of the magnitudes of the short-to-power detection level and the clamp voltage is inversed. In this case, if short-to-power detection in the inactive state of the A/F sensor 10 is performed, even through the actual engine control system 1 is normal, the output of the VS output part 14 rises to the clamp voltage, and it is determined in the comparator C1 of the short-to-power detection unit 25 that the clamp voltage is higher than the short-to-power detection level, whereby a short to power is erroneously detected.

<Clamp and Short-to-Power Detection According to Embodiment>

Figure 4:
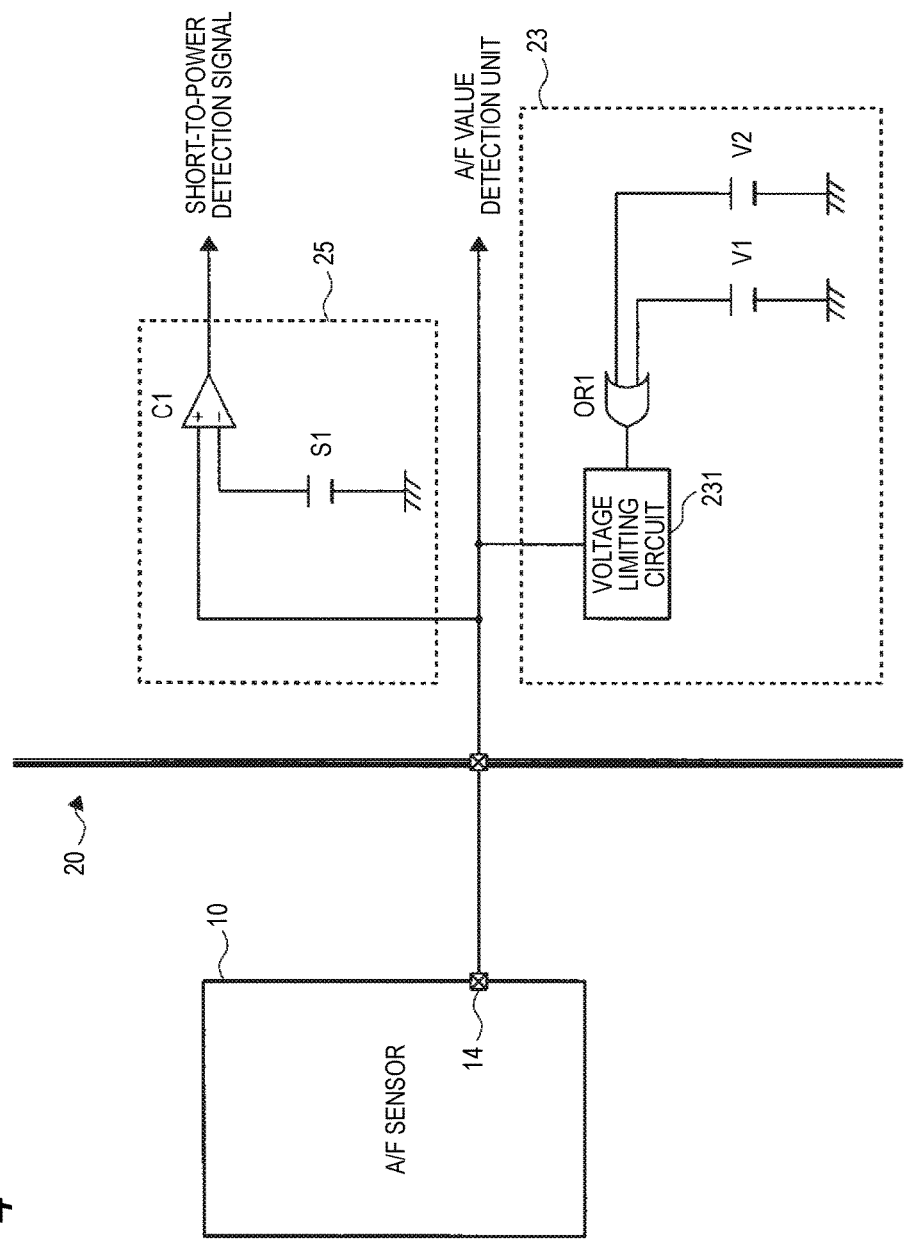
FIG. 4 is a block diagram for explaining clamp and short-to-power detection according to an embodiment.

FIG. 4 is a block diagram for explaining clamp and short-to-power detection according to the present embodiment. It is assumed that the example of FIG. 4 is almost the same as the configuration shown in FIG. 2 but uses a lower value of two clamp voltages in the Hi-clamp unit 23. Specifically, the Hi-clamp unit 23 includes a voltage limiting circuit 231, a selection circuit OR1, a first clamp voltage V1, and a second clamp voltage V2. Also, the selection circuit OR1 shown by an OR gate symbol is a circuit for outputting a lower voltage of input voltages. To the selection circuit OR1, the clamp voltage V1 and the clamp voltage V2 are input. The clamp voltage V1 is the same as the clamp voltage of the example of FIG. 2 described above, and varies depending on the constant voltage VC. The clamp voltage V1 is set to, for example, 6.3 (=VC×0.66+3.0) V. The clamp voltage V2 is a voltage which varies depending on the battery voltage VB, and is set to, for example, (VB−2.0) V. Further, the voltage limiting circuit 231 clamps the output voltage of the VS output part 14 such that a voltage input from the selection circuit becomes the upper limit of the output voltage.

Figure 5A:
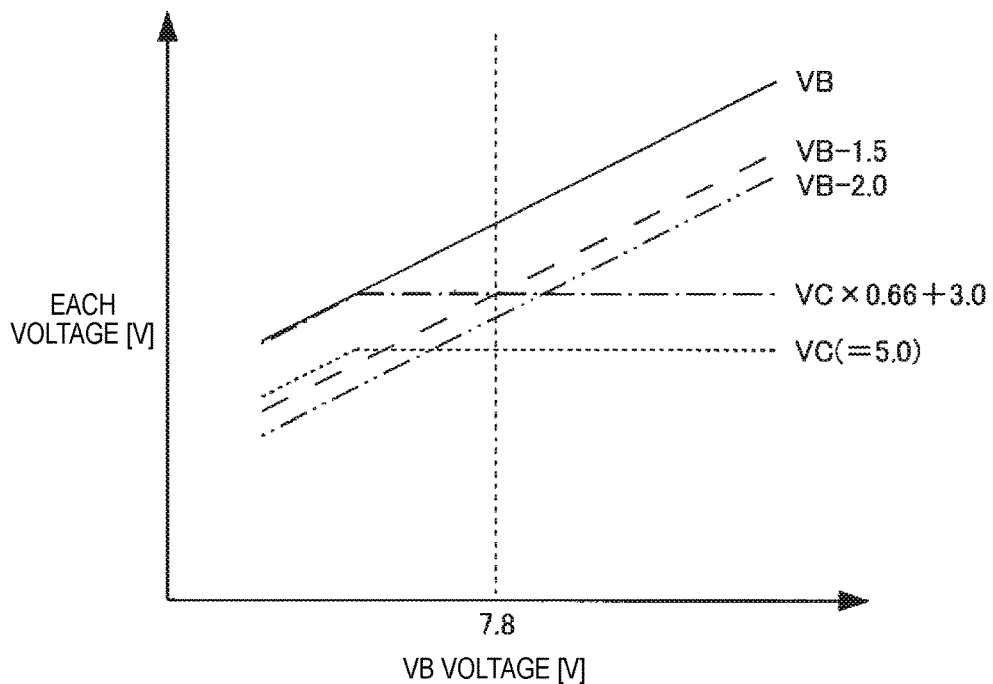
FIG. 5A is a graph illustrating an example of the relation between variation in battery voltage and the value of each voltage according to the embodiment.

FIG. 5A is a graph illustrating an example of the relation between variation in the battery voltage and the value of each voltage according to the present embodiment. The vertical axis represents the value of each voltage, and the horizontal axis represents the battery voltage VB. Similarly to the example of FIG. 3, FIG. 5A shows the value of each voltage in a case where the battery voltage VB linearly varies from about 12.0 V to 5.0 V or less. The battery voltage VB, the short-to-power detection level, the constant voltage VC, and the first clamp voltage (VC×0.66+3.0 V) shown in the graph of FIG. 5A are the same as the battery voltage VB, the short-to-power detection level, the constant voltage VC, and the clamp voltage of FIG. 3, respectively. In the example of FIG. 5A, the second clamp voltage (VB−2.0 V) has been added, and according to the Hi-clamp unit 23 shown in FIG. 4, a smaller value of the first clamp voltage and the second clamp voltage becomes the clamp voltage. In other words, the Hi-clamp unit 23 according to the present embodiment clamps the output voltage of the VS output part 14 to a lower value of (VB−2.0 V) which depends on the battery voltage, similarly to (VB−1.5 V) which is the short-to-power detection level, and is lower than the short-to-power detection level, and (VC×0.66+3.0 V) which depends on the constant voltage VC. Therefore, even if the battery voltage VB varies as shown by a thick solid line in FIG. 5B, thereby becoming any value, the relation of the magnitudes of the short-to-power detection level and the clamp voltage is not inverted, and it is possible to always keep the clamp voltage at a value lower than the short-to-power detection level. Therefore, according to the engine control system 1 of the present embodiment, it is possible to prevent erroneous short-to-power detection.

<Circuit Configuration>

Figure 6:
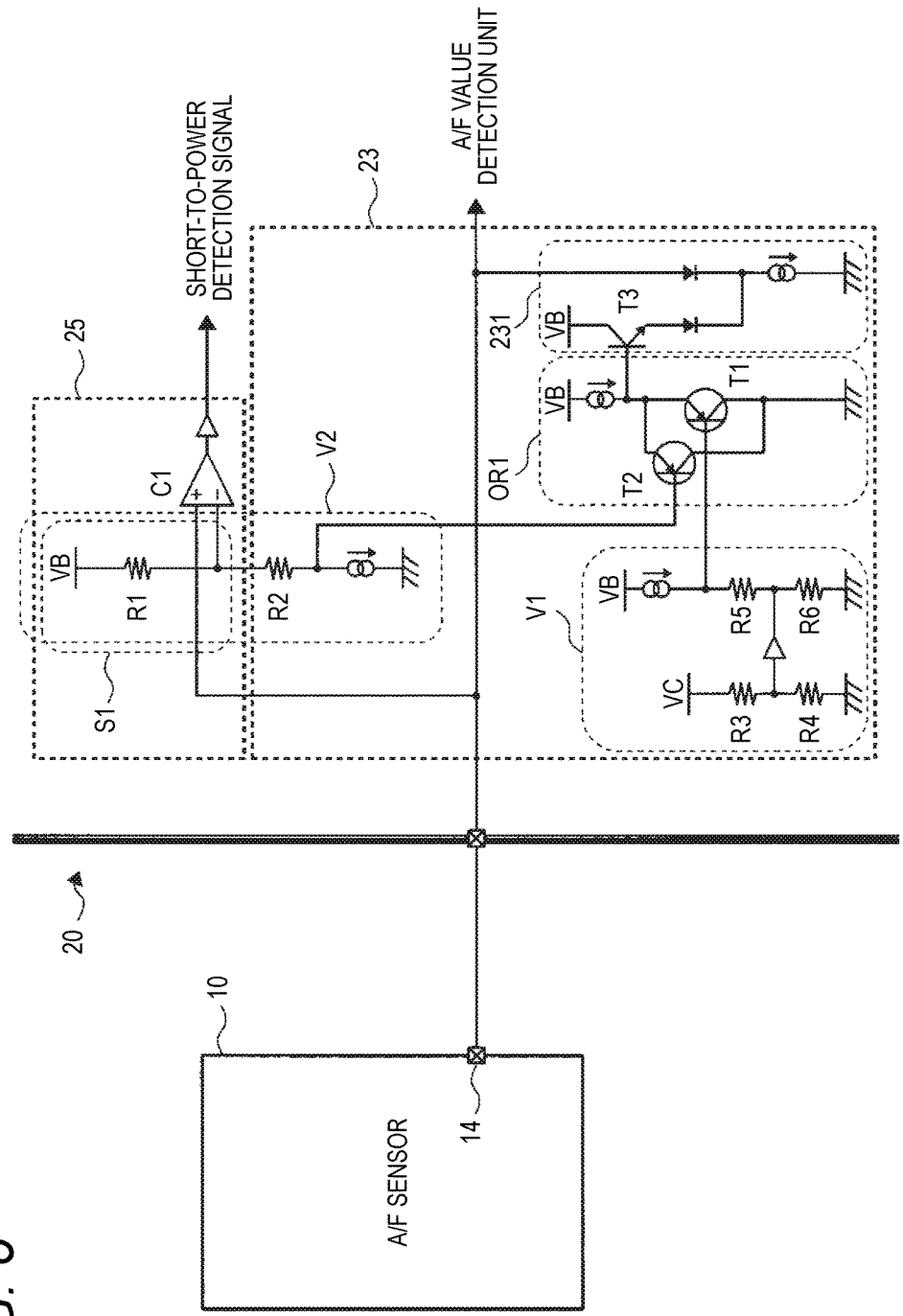
FIG. 6 is a circuit diagram illustrating examples of a Hi-clamp unit and a short-to-power detection unit according to the embodiment.

FIG. 6 is a circuit diagram illustrating examples of the Hi-clamp unit 23 and the short-to-power detection unit 25 according to the present embodiment. The short-to-power detection unit 25 includes the comparator C1, and a circuit (a rectangular shape S1 with rounded corners shown by a broken line in FIG. 6) for generating the threshold value S1 which is the short-to-power detection level. The threshold value S1 is generated by dividing the battery voltage VB by a resistor R1 having one end connected to the battery voltage VB and a resistor R2 having one end connected to the other end of the resistor R1. In the present embodiment, a value lower than the battery voltage VB by 1.5 V is input to one (the inverted input terminal) of the input terminals of the comparator C1. Also, to the other (non-inverted input terminal) of the input terminals of the comparator C1, the output voltage from the VS output part 14 is input. Then, if the output voltage exceeds the threshold value S1 described above, the comparator C1 outputs a short-to-power detection signal. Also, the output voltage from the VS output part 14 is clamped to the predetermined upper limit value, and is input to the comparator C1.

In the circuit (a rectangular shape V1 with rounded corners shown by a broken line) of the Hi-clamp unit 23 which generates the first clamp voltage V1, the constant voltage VC is divided by a resistor R3 having one end connected to the constant voltage VC and a resistor R4 having one end connected to the other end of the resistor R3, whereby, for example, 0.66 times the constant voltage VC is obtained. Therefore, between a resistor R5 having one end connected to the battery voltage VB through a constant current source and a resistor R6 having one end connected to the other end of the resistor R5, (VC×0.66) V generated at the previous stage is input. Since the circuit for generating the first clamp voltage has been designed such that if a predetermined current flows in the resistor R5, a voltage drop of 3.0 V occurs, and the resistor R5 is connected in series with (VC×0.66) V generated at the previous stage, at one end of the resistor R5, (VC×0.66+3.0) V is generated. For example, by this circuit, it is possible to generate the first clamp voltage V1.

Also, a circuit (a rectangular shape V2 with rounded corners shown by a broken line) which generates the second clamp voltage V2 divides the battery voltage VB by the resistor R1 having one end connected to the battery voltage VB and the resistor R2 having one end connected to the other end of the resistor R1, thereby generating the second clamp voltage. In the present embodiment, it is assumed that the circuit which generates the second clamp voltage has been designed such that a voltage drop of 0.2 V from the battery voltage VB occurs at the other end of the resistor R2. Also, the other end of the resistor R2 is connected to a ground through a constant current source. For example, by this circuit, it is possible to generate the second clamp voltage V2.

Also, the selection circuit OR1 includes a PNP transistor T1 (also referred to as a "first PNP transistor") and a PNP transistor T2 (also referred to as a "second PNP transistor") connected in parallel. To the base (B) of the PNP transistor T1, the first clamp voltage V1 is input, and to the base of the PNP transistor T2, the second clamp voltage V2 is input. Also, to the emitter (E) of the PNP transistor T1 and the emitter of the PNP transistor T2, the battery voltage VB is input through a constant current source. Further, the collector (C) of the PNP transistor T1 and the collector of the PNP transistor T2 are connected to the ground. Here, the PNP transistor T1 and the PNP transistor T2 are transistors having the same rating. Since the inputs to the emitters are the same as each other, the potential difference between the base and emitter of one of the transistors T1 and T2 in which the voltage input to the base is lower is larger, and thus the corresponding transistor is likely to be activated. Therefore, in the selection circuit, a PNP transistor whose base is connected to a lower one of the first clamp voltage V1 and the second clamp voltage V2 operates.

In the voltage limiting circuit (a rectangular shape 231 with rounded corners shown by a broken line), the output from the selection circuit OR1 is input to the base of an NPN transistor T3. Also, to the collector of the NPN transistor T3, the battery voltage VB is input. The emitter of the NPN transistor T3 is connected to the anode of a first diode, and the cathode of the first diode is connected to the ground through a constant current source. Also, the output from the VS output part 14 is input to the anode of a second diode, and the cathode of the second diode is connected to the cathode of the first diode and is connected to the ground through the constant current source. The voltage limiting circuit 231 is a general limiter circuit, and can limit the output of the VS output part 14 to the output voltage of the selection circuit OR1.

Figure 5B:
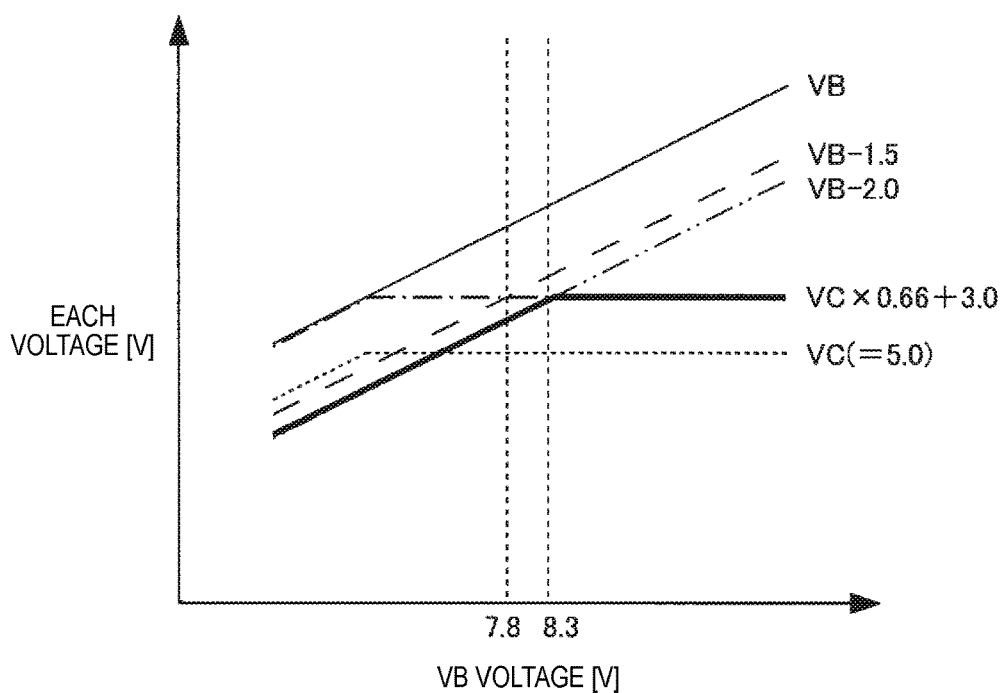
FIG. 5B is a graph illustrating an example of the relation between variation in battery voltage and the value of each voltage according to the embodiment.

This circuit configuration makes it possible to provide the Hi-clamp unit 23 which uses a smaller one of the first clamp voltage and the second clamp voltage as a clamp voltage. In other words, as shown in FIGS. 5A and 5B, regardless of the value of the battery voltage VB, it is possible to prevent inversion of the relation of the magnitudes of the short-to-power detection level and the clamp voltage, and it is possible to prevent erroneous short-to-power detection.

<First Modification>

Figure 7:
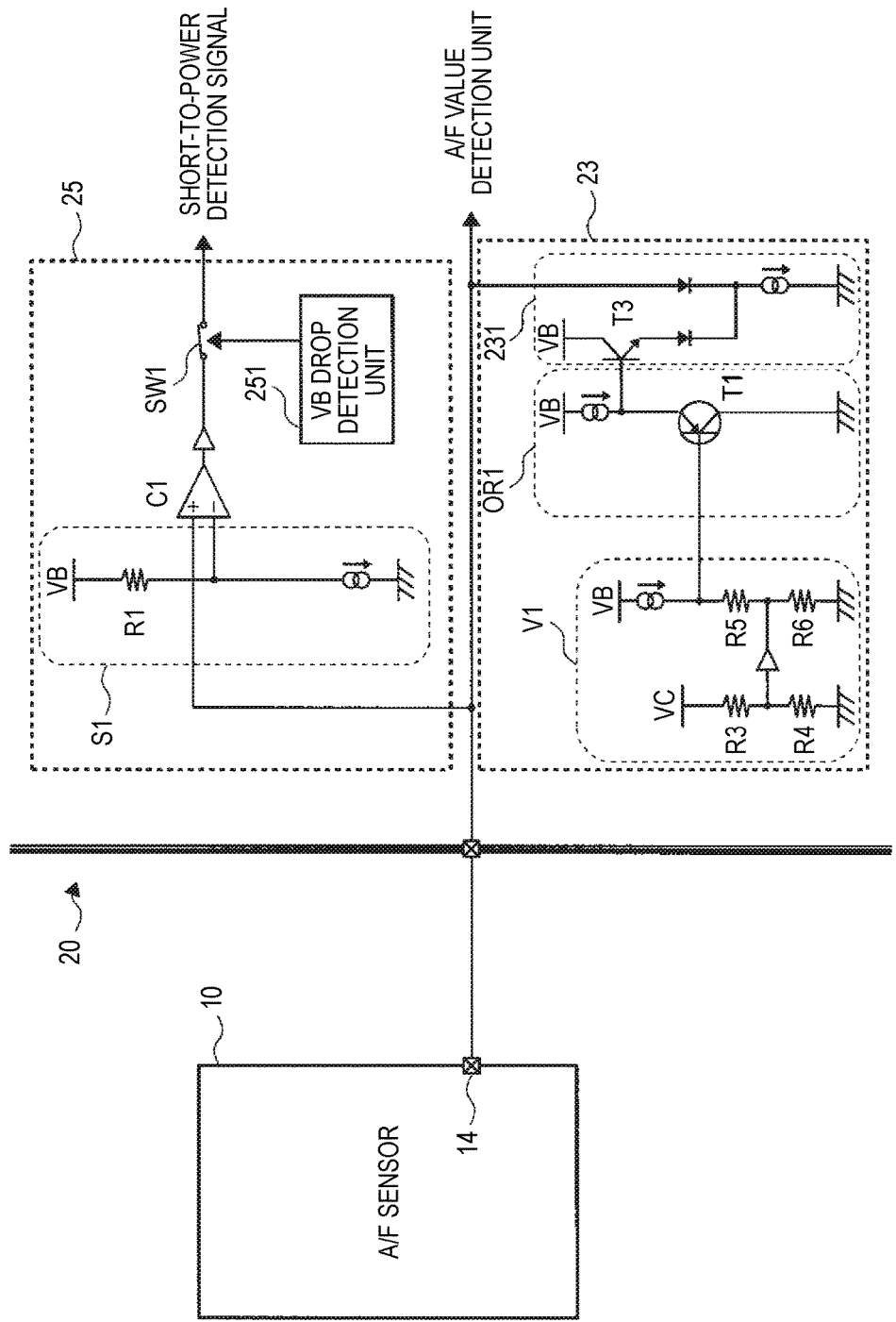
FIG. 7 is a circuit diagram illustrating examples of a Hi-clamp unit and a short-to-power detection unit according to a first modification.

FIG. 7 is a circuit diagram illustrating examples of a Hi-clamp unit 23 and a short-to-power detection unit 25 according to a first modification. In modifications, components corresponding to those of the above described embodiment are denoted by the same reference symbols, and differences will be mainly described. The Hi-clamp unit 23 according to the first modification generates only the first clamp voltage V1 (VC×0.66+3.0 V), and limits the output voltage of the VS output part 14 to the first clamp voltage V1 or less. Meanwhile, the short-to-power detection unit 25 includes a comparator C1 which outputs a short-to-power detection signal in a case where the clamped output voltage from the VS output part 14 is higher than the short-to-power detection level. Also, in the first modification, the short-to-power detection unit further includes a VB drop detection unit 251 which detects a drop of the battery voltage VB, and a switch SW1 which breaks connection of a signal line in response to reception of a signal from the VB drop detection unit 251. The switch SW1 is provided before the output of the comparator C1, and if the switch SW1 is turned off, a short-to-power detection signal cannot be output from the short-to-power detection unit 25. Also, the VB drop detection unit 251 turns off the switch SW1, for example, if the battery voltage VB is lower than a predetermined voltage. In the present modification, it is assumed that the VB drop detection unit 251 turns off the switch SW1 if detecting that the battery voltage VB is lower than, for example, 8.5 V. Even in this configuration, it is possible to prevent erroneous short-to-power detection even if the battery voltage VB drops.

<Second Modification>

Figure 8:
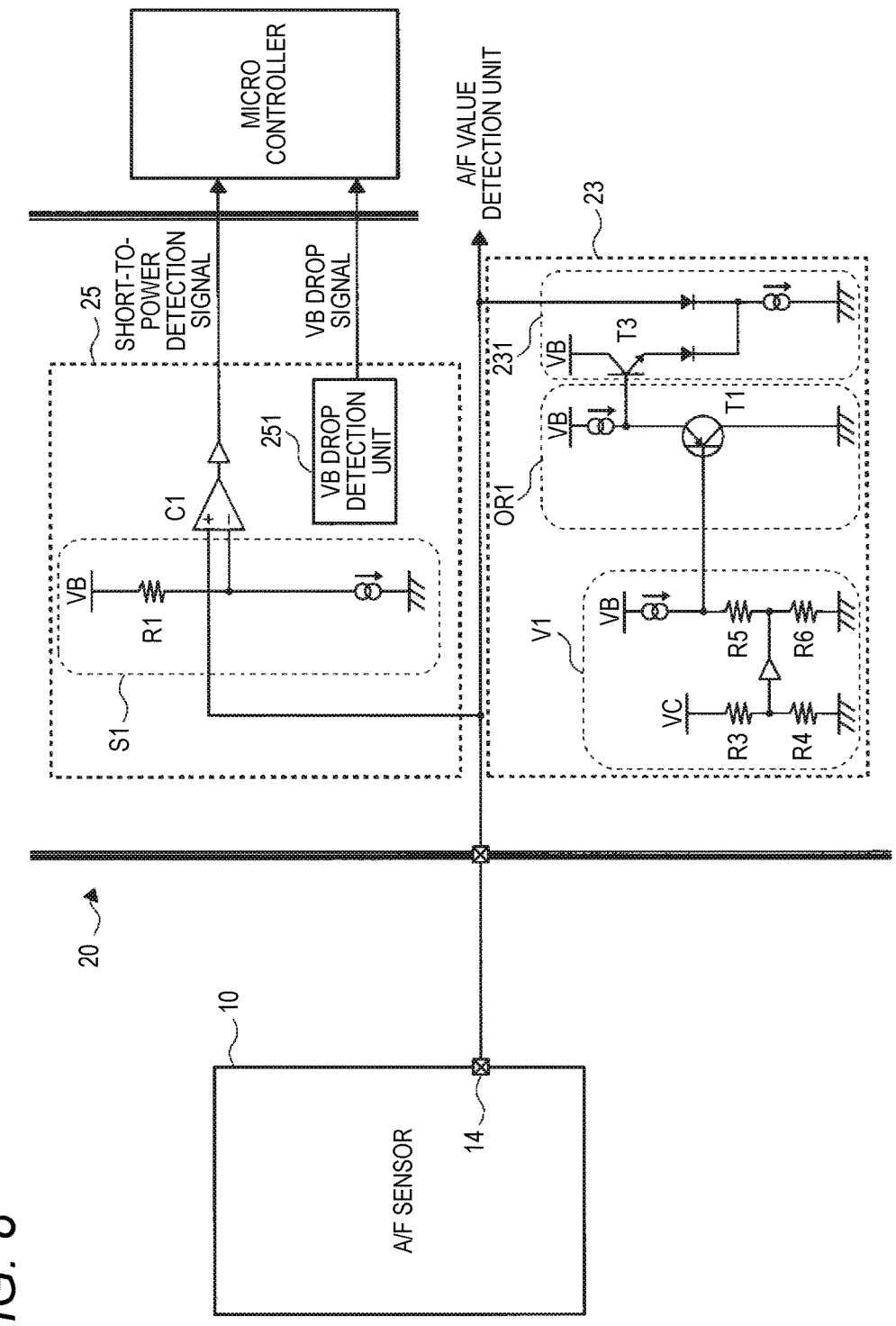
FIG. 8 is a circuit diagram illustrating examples of a Hi-clamp unit and a short-to-power detection unit according to a second modification.

FIG. 8 is a circuit diagram illustrating examples of a Hi-clamp unit 23 and a short-to-power detection unit 25 according to a second modification. The Hi-clamp unit 23 according to the first modification generates only the first clamp voltage V1 (VC×0.66+3.0 V), and limits the output voltage of the VS output part 14 to the first clamp voltage V1 or less. Meanwhile, the short-to-power detection unit 25 includes the comparator C1 which outputs a short-to-power detection signal in a case where the clamped output voltage from the VS output part 14 is higher than the short-to-power detection level. Also, the A/F control unit 20 includes the VB drop detection unit 251 which outputs a short-to-power detection signal if detecting a drop of the battery voltage VB. In the present modification, it is assumed that the VB drop detection unit 251 outputs a VB drop signal if detecting that the battery voltage VB is lower than, for example, 8.5 V. Also, in the second modification, the short-to-power detection unit 25 outputs the short-to-power detection signal and the VB drop signal to another micro controller. This micro controller is a device for shutting down the system if a short to power occurs.

Figure 9:
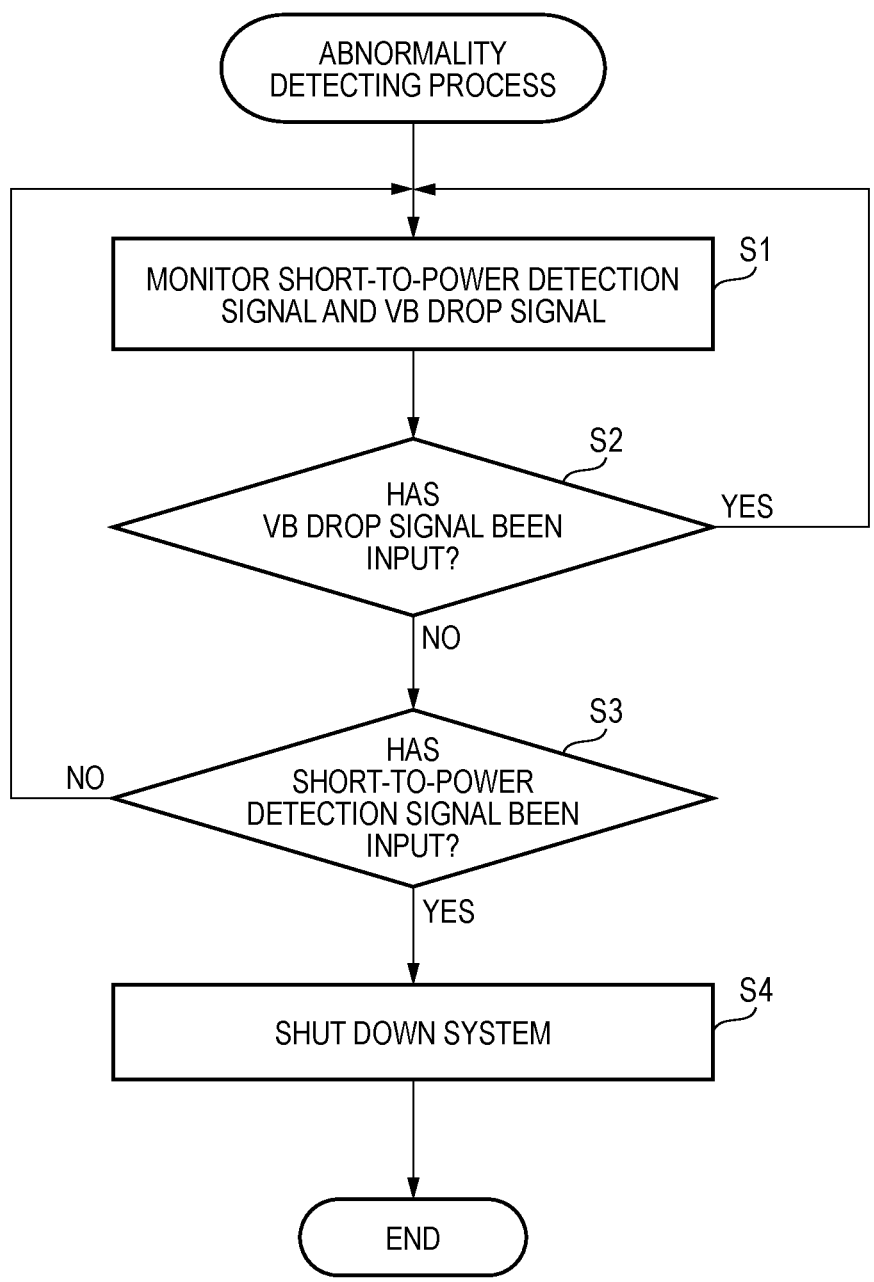
FIG. 9 is a processing flow chart illustrating an example of an abnormality detecting process which is performed by a micro controller of the second modification.

FIG. 9 is a processing flow chart illustrating an example of an abnormality detecting process which is performed by the micro controller of the second modification. In STEP S1 of FIG. 9, the micro controller monitors whether a short-to-power detection signal and a VB drop signal are output from the short-to-power detection unit 25. Also, in STEP S2, the micro controller determines whether a VB drop signal has been input. In STEP S2, the micro controller determines whether a VB drop signal output since the battery voltage VB was lower than, for example, 8.5 V has been input. In a case where a VB drop signal has been input ("YES" in STEP S2), the abnormality detecting process returns to the process of STEP S1, and the micro controller keeps on signal monitoring. In this system, if the battery voltage VB drops, it is feared that erroneous short-to-power detection may occur. For this reason, in STEP S2, abnormality determination is avoided. In a case where a VB drop signal has not been input ("NO" in STEP S2), in STEP S3, the micro controller determines whether a short-to-power detection signal has been input. In STEP S3, the micro controller determines whether a short-to-power detection signal output since the output voltage from the VS output part 14 exceeded the short-to-power detection level has been input. In a case where a short-to-power detection signal has not been input ("NO" in STEP S3), the abnormality detecting process returns to the process of STEP S1, and the micro controller keeps on signal monitoring. Meanwhile, in a case where a short-to-power detection signal has been input ("YES" in STEP S3), in STEP S4, the micro controller determines that an abnormality has occurred, and shuts down the system. According to this second modification, on the micro controller side, it is possible to prevent erroneous short-to-power detection by software.

<Other Modifications>

The present invention is not limited to the above described embodiment, and can be modified without departing from the scope of the present invention. For example, at least some of the functions of the A/F control unit 20 described above may be implemented by an integrated circuit. Also, in the processing flow shown in the embodiment, the order of the processes may be changed as long as the result does not change, or some processes may be performed in parallel. Also, the specific values of the voltages and the like described above are illustrative, and predetermined arbitrary values can be used.

What is claimed is:

1. An abnormality detecting circuit comprising:
   a clamp unit configured to clamp an output voltage which is output from another device, such that the upper limit of the output voltage becomes a first clamp voltage which is generated on the basis of a constant voltage generated from a power supply voltage and which does not change with respect to the power supply voltage, or a second clamp voltage which is generated on the basis of the power supply voltage and which varies with respect to the power supply voltage; and
   a short-to-power detection unit configured to compare the output voltage clamped by the clamp unit, with a predetermined threshold value which is generated on the basis of the power supply voltage, thereby detecting occurrence of a short to power.

2. The abnormality detecting circuit according to claim 1, wherein the first clamp voltage is a voltage higher than the constant voltage by a predetermined value,
   wherein the second clamp voltage is a voltage lower than the power supply voltage by a predetermined value, and
   wherein the clamp unit selects a lower voltage of the first clamp voltage and the second clamp voltage, and clamps the output voltage to the selected voltage.

3. The abnormality detecting circuit according to claim 1, wherein the another device is a predetermined sensor, and the sensor can output a voltage having a magnitude close to the power supply voltage in an inactive state after start-up.

4. The abnormality detecting circuit according to claim 1, wherein the clamp unit includes a first PNP transistor having a base to which the first clamp voltage is input, and a second PNP transistor having a base to which the second clamp voltage is input, and
   wherein an emitter of the first PNP transistor and an emitter of the second PNP transistor are connected to each other.

5. An abnormality detecting method comprising:
   a clamping step of clamping an output voltage which is output from another device, such that the upper limit of the output voltage becomes a first clamp voltage which is generated on the basis of a constant voltage generated from a power supply voltage and which does not change with respect to the power supply voltage, or a second clamp voltage which is generated on the basis of the power supply voltage and which varies with respect to the power supply voltage; and
   a short-to-power detecting step of comparing the output voltage clamped in the clamping step, with a predetermined threshold value which is generated on the basis of the power supply voltage, thereby detecting occurrence of a short to power.

6. The abnormality detecting circuit according to claim 2, wherein the another device is a predetermined sensor, and the sensor can output a voltage having a magnitude close to the power supply voltage in an inactive state after start-up.

7. The abnormality detecting circuit according to claim 2, wherein the clamp unit includes a first PNP transistor having a base to which the first clamp voltage is input, and a second PNP transistor having a base to which the second clamp voltage is input, and
   wherein an emitter of the first PNP transistor and an emitter of the second PNP transistor are connected to each other.

8. The abnormality detecting circuit according to claim 3, wherein the clamp unit includes a first PNP transistor having a base to which the first clamp voltage is input, and a second PNP transistor having a base to which the second clamp voltage is input, and wherein an emitter of the first PNP transistor and an emitter of the second PNP transistor are connected to each other.

9. The abnormality detecting circuit according to claim 6, wherein the clamp unit includes a first PNP transistor having a base to which the first clamp voltage is input, and a second PNP transistor having a base to which the second clamp voltage is input, and wherein an emitter of the first PNP transistor and an emitter of the second PNP transistor are connected to each other.

* * * * *